(12) United States Patent
Shi et al.

(10) Patent No.: US 11,378,846 B2
(45) Date of Patent: Jul. 5, 2022

(54) DISPLAY SUBSTRATE, MANUFACTURING METHOD THEREOF AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Bo Shi, Beijing (CN); Yuanjie Xu, Beijing (CN); Wenhua Song, Beijing (CN); Ting Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 106 days.

(21) Appl. No.: 17/040,238

(22) PCT Filed: Dec. 19, 2019

(86) PCT No.: PCT/CN2019/126629
§ 371 (c)(1),
(2) Date: Sep. 22, 2020

(87) PCT Pub. No.: WO2021/120104
PCT Pub. Date: Jun. 24, 2021

(65) Prior Publication Data
US 2021/0191172 A1   Jun. 24, 2021

(51) Int. Cl.
*G02F 1/1339* (2006.01)
*H01L 27/12* (2006.01)

(52) U.S. Cl.
CPC ......... *G02F 1/1339* (2013.01); *H01L 27/124* (2013.01); *H01L 27/1262* (2013.01)

(58) Field of Classification Search
CPC .. G02F 1/1339; H01L 27/124; H01L 27/1262
See application file for complete search history.

(56) References Cited

U.S. PATENT DOCUMENTS

2006/0066604 A1   3/2006   Yang

FOREIGN PATENT DOCUMENTS

| CN | 1752823 A | 9/2005 |
|---|---|---|
| CN | 103885252 A | 6/2014 |

(Continued)

*Primary Examiner* — Peter M Albrecht
(74) *Attorney, Agent, or Firm* — Dilworth & Barrese, LLP.; Michael J. Musella, Esq.

(57) ABSTRACT

A display substrate, a manufacturing method thereof and a display device. The display substrate includes a working area and a sealant setting area outside of the working area. The display substrate further includes: a base substrate, a first conductive structure on a first side of the base substrate, and a second conductive structure on one side of the first conductive structure away from the base substrate. The first conductive structure and the second conductive structure are in the sealant setting area. The second conductive structure at least includes an inclined part inclined relative to a main surface of the base substrate. The inclined part is configured to allow at least part of light to be exited out directly over the first conductive structure after the light incident into the inclined part from a second side of the base substrate opposite to the first side is reflected by the inclined part.

19 Claims, 5 Drawing Sheets

(56) References Cited

FOREIGN PATENT DOCUMENTS

| | | | |
|---|---|---|---|
| CN | 104635394 A | | 5/2015 |
| JP | 2011033688 A | | 2/2011 |
| JP | 2015087480 A | * | 5/2015 |
| JP | 2015087480 A | | 5/2015 |

* cited by examiner

DISPLAY SUBSTRATE, MANUFACTURING METHOD THEREOF AND DISPLAY DEVICE

TECHNICAL FIELD

Embodiments of the present disclosure relate to a display substrate, a manufacturing method thereof and a display device.

BACKGROUND

With the development of optoelectronic technology and semiconductor manufacturing technology, in display devices, for example, thin film transistor liquid crystal displays (TFT-LCDs) occupy a dominant position in the current display market due to advantages of high image quality, high space utilization, low power consumption, non-radiation, etc.

For example, in the manufacturing process of the TFT-LCD, a color filter (CF) substrate and an array substrate need to be cell-assembled and bonded. The array substrate and the CF substrate are bonded together by sealant, and silicon balls, glass fibers and other supports are required to be added into the sealant to support the cell gap of a liquid crystal panel. The sealant not only plays roles of bonding the array substrate and the CF substrate and supporting the cell gap, but also is used to seal liquid crystals. Generally, the coating range of the sealant is at the periphery of the CF substrate, that is, in a sealant area outside of a display area. Therefore, the sealant is the key material in the cell-assembly manufacturing process of the TFT-LCD.

SUMMARY

At least one embodiment provides a display substrate, comprising a working area and a sealant setting area outside of the working area. The display substrate further comprises: a base substrate, a first conductive structure provided on a first side of the base substrate, and a second conductive structure provided on one side of the first conductive structure away from the base substrate; both the first conductive structure and the second conductive structure are provided in the sealant setting area; the second conductive structure at least includes an inclined part inclined relative to a main surface of the base substrate; and the inclined part is configured to allow at least part of light to be exited out directly over the first conductive structure after the light incident into the inclined part from a second side of the base substrate opposite to the first side is reflected by the inclined part.

For example, in the display panel provided in at least one embodiment of the present disclosure, an orthographic projection of the inclined part on the base substrate at least partially overlaps with an orthographic projection of the first conductive structure on the base substrate.

For example, in the display panel provided in at least one embodiment of the present disclosure, the first conductive structure includes a first inclined surface inclined relative to the main surface of the base substrate, and the orthographic projection of the inclined part on the base substrate at least partially overlaps with an orthographic projection of the first inclined surface on the base substrate.

For example, the display panel provided in at least one embodiment of the present disclosure further comprises a lug boss provided on the base substrate. An orthographic projection of a surface of the lug boss away from the base substrate on the base substrate is within an orthographic projection of a surface of the lug boss near the base substrate on the base substrate; and a part corresponding to the first inclined surface is provided on a first side surface of the lug boss.

For example, in the display panel provided in at least one embodiment of the present disclosure, the second conductive structure includes a first part and a second part which are provided in a direction parallel to the main surface of the base substrate; and both the first part and the second part include the inclined part.

For example, in the display panel provided in at least one embodiment of the present disclosure, the first part and the second part are spaced from each other; and the orthographic projection of the first conductive structure on the base substrate is between an orthographic projection of an end portion of the inclined part of the first part near the base substrate on the base substrate and an orthographic projection of an end portion of the inclined part of the second part near the base substrate on the base substrate.

For example, in the display panel provided in at least one embodiment of the present disclosure, the orthographic projection of the first conductive structure on the base substrate at least partially overlaps with an orthographic projection of the inclined part of the first part on the base substrate, and/or the orthographic projection of the first conductive structure on the base substrate at least partially overlaps with an orthographic projection of the inclined part of the second part on the base substrate.

For example, in the display panel provided in at least one embodiment of the present disclosure, the orthographic projection of the first conductive structure on the base substrate is between an orthographic projection of the first part on the base substrate and an orthographic projection of the second part on the base substrate.

For example, in the display panel provided in at least one embodiment of the present disclosure, the first conductive structure includes a first inclined surface and a second inclined surface which are provided in a direction parallel to the base substrate; and the first inclined surface and the second inclined surface are inclined relative to the main surface of the base substrate.

For example, the display panel provided in at least one embodiment of the present disclosure further comprises a lug boss provided on the base substrate, an orthographic projection of a surface of the lug boss away from the base substrate on the base substrate is within an orthographic projection of a surface of the lug boss near the base substrate on the base substrate; a part corresponding to the first inclined surface is provided on a first side surface of the lug boss; and a part corresponding to the second inclined surface is provided on a second side surface of the lug boss opposite to the first side surface.

For example, in the display panel provided in at least one embodiment of the present disclosure, a part corresponds to the first inclined surface is parallel to the inclined part of the first part; and a part corresponds to the second inclined surface is parallel to the inclined part of the second part.

For example, in the display panel provided in at least one embodiment of the present disclosure, in a direction perpendicular to the main surface of the base substrate, an insulating layer is provided between the first conductive structure and the second conductive structure and the insulating layer includes a protrusion protruded towards one side away from the base substrate; an orthographic projection of a surface of the protrusion away from the base substrate on the base substrate is within an orthographic projection of a surface of the protrusion near the base substrate on the base substrate; and the inclined part is provided on a side surface of the protrusion.

For example, in the display panel provided in at least one embodiment of the present disclosure, the first part and the second part are connected with each other; and the first conductive structure includes a third part and a fourth part spaced from each other in a direction parallel to the base substrate.

For example, in the display panel provided in at least one embodiment of the present disclosure, an orthographic projection of an end portion of the inclined part of the first part away from the base substrate on the base substrate is within an orthographic projection of the third part on the base substrate; and an orthographic projection of an end portion of the inclined part of the second part away from the base substrate on the base substrate is within an orthographic projection of the fourth part on the base substrate.

For example, in the display panel provided in at least one embodiment of the present disclosure, an orthographic projection of the second conductive structure on the base substrate is between an orthographic projection of the third part on the base substrate and an orthographic projection of the fourth part on the base substrate.

For example, in the display panel provided in at least one embodiment of the present disclosure, an insulating layer is provided between the first conductive structure and the second conductive structure in the direction perpendicular to the main surface of the base substrate, and the insulating layer includes a recessed part which is recessed towards one side near the base substrate; a cross-sectional shape of the recessed part is trapezoid in a plane perpendicular to the main surface of the base substrate, a side length of a side of the trapezoid away from the base substrate is greater than a side length of a side of the trapezoid near the base substrate; the inclined part of the first part is provided on a first side surface of the recessed part; and the inclined part of the second part is provided on a second side surface of the recessed part opposite to the first side surface.

For example, in the display panel provided in at least one embodiment of the present disclosure, on one side of the inclined part away from the base substrate, on an end portion on one side of the inclined part near the base substrate, an included angle between the inclined part and a normal line of the main surface of the base substrate running through the end portion is 20°-80°.

For example, in the display panel provided in at least one embodiment of the present disclosure, on one side of the inclined part away from the base substrate, on the end portion on one side of the inclined part near the base substrate, the included angle between the inclined part and the normal line of the main surface of the base substrate running through the end portion is 40°-60°.

For example, in the display panel provided in at least one embodiment of the present disclosure, light incident to the inclined part from the second side opposite to the first side of the base substrate is perpendicular to the main surface of the base substrate.

For example, in the display panel provided in at least one embodiment of the present disclosure, a first electrode and a second electrode are provided in the working area; the first conductive structure and the first electrode are formed by a same patterning process; and the second conductive structure and the second electrode are formed by a same patterning process.

For example, in the display panel provided in at least one embodiment of the present disclosure, thin-film transistors (TFTs) are provided in the working area, each TFT includes a gate electrode and source/drain electrodes; the first electrode is the gate electrode and the second electrode is the source/drain electrode; or the first electrode is the source/drain electrode and the second electrode is the gate electrode.

For example, in the display panel provided in at least one embodiment of the present disclosure, the first conductive structure and the second conductive structure are configured to transmit data signals, gate scanning signals, common electrode signals, clock signals, gate control signals, gate on array (GOA) forward scanning signals, GOA reverse scanning signals or trigger signals.

At least one embodiment also provides a display device, comprising any of the display substrates above and an opposite substrate cell-assembled with the display substrate. The display substrate and the opposite substrate are connected with each other by sealant provided in the sealant setting area; and in the direction perpendicular to the base substrate, the first conductive structure and the second conductive structure are provided between the base substrate and the sealant.

At least one embodiment also provides a method of manufacturing a display substrate. The display substrate includes a working area and a sealant setting area provided outside of the working area. The manufacturing method comprises: providing a base substrate; forming a first conductive structure on a first side of the base substrate; and forming a second conductive structure on one side of the first conductive structure away from the base substrate, in which both the first conductive structure and the second conductive structure are provided in the sealant setting area; the second conductive structure at least includes an inclined part inclined relative to a main surface of the base substrate; and the inclined part is configured to allow at least part of light to be exited out directly over the first conductive structure after the light incident into the inclined part from a second side of the base substrate opposite to the first side is reflected by the inclined part.

For example, in the method provided in at least one embodiment of the present disclosure, before forming the first conductive structure, the method further comprises forming a lug boss on the base substrate; an orthographic projection of a surface of the lug boss away from the base substrate on the base substrate is within an orthographic projection of a surface of the lug boss near the base substrate on the base substrate; and the forming the first conductive structure on the first side of the base substrate includes: forming the first conductive structure on a surface of the lug boss.

For example, the method provided in at least one embodiment of the present disclosure further comprises: after forming the first conductive structure and before forming the second conductive structure, forming an insulating layer on the first conductive structure. The insulating layer includes a protrusion protruded towards one side away from the base substrate; an orthographic projection of a surface of the protrusion away from the base substrate on the base substrate is within an orthographic projection of a surface of the protrusion near the base substrate on the base substrate; and the inclined part is provided on a side surface of the protrusion.

For example, the method provided in at least one embodiment of the present disclosure further comprises: after forming the first conductive structure and before forming the second conductive structure, forming an insulating layer on the first conductive structure. The first conductive structure includes a third part and a fourth part spaced from each other in a direction parallel to the base substrate; the insulating layer includes a recessed part recessed towards one side near the base substrate; an orthographic projection of a surface of the recessed part near the base substrate on the base substrate is within an orthographic projection of a surface of the recessed part away from the base substrate on the base substrate; and the inclined part is provided on a side surface of the recessed part.

BRIEF DESCRIPTION OF THE DRAWINGS

In order to more clearly explain the technical proposals of the embodiments of the present disclosure, the drawings of the embodiments will be briefly described below. Apparently, the drawings described below only relate to some embodiments of the present disclosure and do not limit the present disclosure.

DETAILED DESCRIPTION

Figure 1:
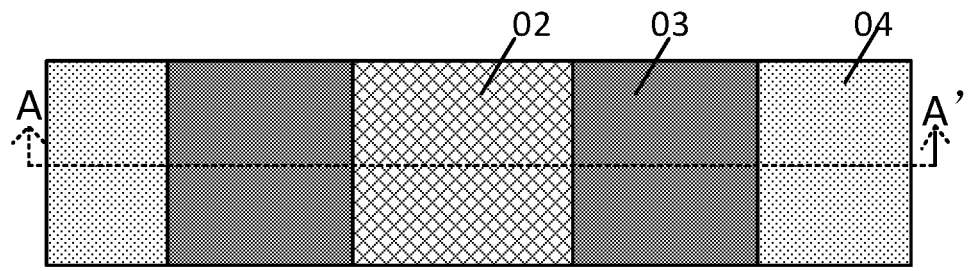
FIG. 1 is a schematically structural plan view of a display substrate.

To make objectives, technical schemes, and advantages of the present embodiments clearer, technical schemes of the embodiments will be described in a clearly and fully understandable way in connection with the drawings related to the embodiments of the disclosure. It is apparent that the described embodiments are a part but not all of the embodiments of the disclosure. Based on the described embodiments herein, one of ordinary skill in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as 'first,' 'second,' or the like, which are used in the present disclosure, are not intended to indicate any sequence, amount or importance, but for distinguishing various components. The terms, such as 'comprise/comprising,' 'include/including,' or the like, are intended to specify that the elements or the objects stated before these terms encompass the elements or the objects and equivalents thereof listed after these terms, but not preclude other elements or objects. The phrases "connect/connection", "connected/connecting", etc., are not intended to be limited to a physical connection or a mechanical connection, but may also include an electrical connection, directly or indirectly. The terms, 'on,' 'under,' 'left,' 'right,' or the like are only used to indicate relative position relationship, and when the absolute position of the object which is described is changed, the relative position relationship may be changed accordingly.

At present, the market has higher and higher requirements for curved display, and a curved display panel is usually manufactured by thinning and bending a panel. However, after the display panel is bent, due to the presence of stress, the adhesive property of sealant in the display panel will be affected, and the sealant is prone to be damaged under mechanical vibration. Moreover, in the pressure cooker test (PCT) experiment, the sealant at four corners of the display panel is prone to fall off. The fall-off of the sealant will have a serious impact on the display panel, for example, it is prone to cause liquid crystal leakage in a liquid crystal display (LCD) panel. Therefore, it is necessary to enhance the adhesive property of the sealant. The adhesive property is stronger when the curing property of the sealant is higher, it is necessary to improve the curing performance of the sealant.

The main compositions of the commonly used sealant are epoxy resins and acrylic resins, in which the epoxy resins are heat-cured resins, and the acrylic resins are light-cured resins. Acrylic resins need to be cured by ultraviolet (UV) light. When the display substrate is encapsulated by sealant, there is usually a case that partial sealant cannot be cured by UV light in the UV curing process. Therefore, in order to enhance the UV curing ability, the proportion of the hollowed-out area between signal traces at coating positions of the sealant can be improved, so that more UV light can irradiate the sealant. However, at present, the way of narrowing the width of metal wires or reducing the number of the metal wires is generally used to increase the proportion of the hollowed-out area between the signal wires at the coating positions of the sealant, but this will increase the resistance of the metal wires and affects the conductive properties of the metal wires.

Figure 2:
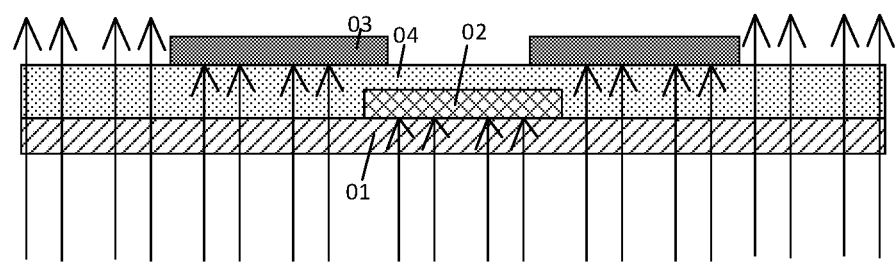
FIG. 2 is a schematically structural sectional view formed by cutting along A-A' in FIG. 1.

For instance, FIG. 1 is a schematically structural plan view of a display substrate. FIG. 2 is a schematically structural sectional view formed by cutting along A-A' in FIG. 1. With reference to FIGS. 1 and 2, a lower metal wiring 02 is disposed on a base substrate 01; an insulating layer 04 is disposed on the lower metal wiring 02; and an upper metal wiring 03 is disposed on the insulating layer 04 and includes two parts which are spaced from each other and opposite to each other in a direction parallel to a main surface of the base substrate 01. An overlap part is formed between an orthographic projection of the upper metal wiring 03 on the base substrate 01 and an orthographic projection of the lower metal wiring 02 on the base substrate 01, and light incident from one side of the base substrate 01 away from the lower metal wiring 02 cannot run through the lower metal wiring 02, so that the light cannot reach a sealant setting area over the lower metal wiring 02 and irradiate the sealant, and the adhesive property of the sealant is affected, so that the sealant can be easily damaged or stripped off under a mechanical vibration. It is to be noted that the orthographic projection of the upper metal wiring 03 on the base substrate 01 and the orthographic projection of the lower metal wiring 02 on the base substrate 01 may be only intersected and do not have an overlapping part, or the orthographic projection of the upper metal wiring 03 on the base substrate 01 and the orthographic projection of the lower metal wiring 02 on the base substrate 01 may not be intersected and do not have an overlapping part. No limitation will be given here.

Figure 3:
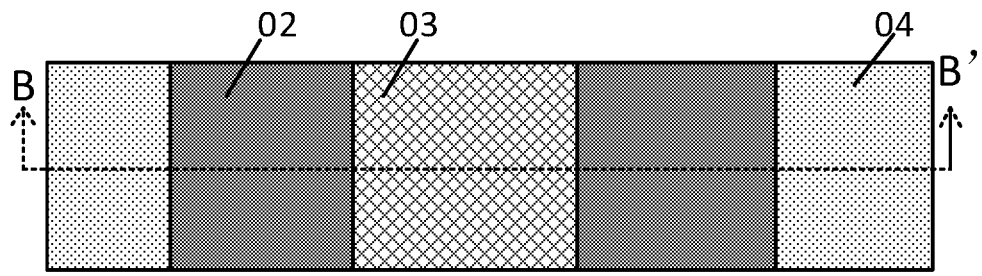
FIG. 3 is a schematically structural plan view of another display substrate.
Figure 4:
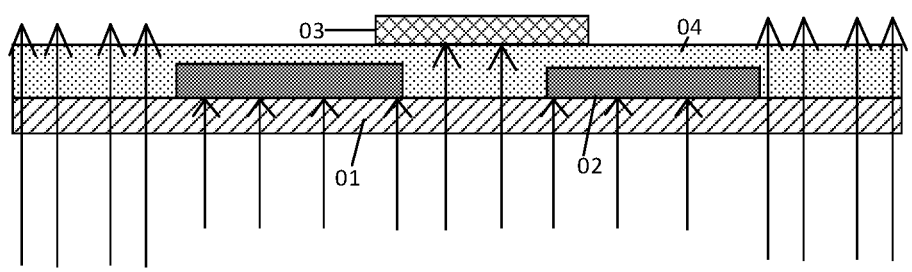
FIG. 4 is a schematically structural sectional view formed by cutting along B-B' in FIG. 3.

For instance, FIG. 3 is a schematically structural plan view of another display substrate. FIG. 4 is a schematically structural sectional view formed by cutting along B-B' in FIG. 3. With reference to FIGS. 3 and 4, a lower metal wiring 02 is disposed on the base substrate 01; an insulating layer 04 is disposed on the lower metal wiring 02; and an upper metal wiring 03 is disposed on the insulating layer 04 and includes two parts which are spaced from and opposite to each other. An overlapping part is formed between an orthographic projection of the upper metal wiring 03 on the base substrate 01 and an orthographic projection of the lower metal wiring 02 on the base substrate 01, and light incident from one side of the base substrate 01 away from the lower metal wiring 02 cannot run through the lower metal wiring 02, so the light cannot reach a sealant setting area over the lower metal wiring 02, and the adhesive property of the sealant is affected, and the sealant can be easily damaged or stripped off under a mechanical vibration. It is to be noted that the orthographic projection of the upper metal wiring 03 on the base substrate 01 and the orthographic projection of the lower metal wiring 02 on the base substrate 01 may be only intersected and do not have an overlapping part, or the orthographic projection of the upper metal wiring 03 on the base substrate 01 and the orthographic projection of the lower metal wiring 02 on the base substrate 01 may not be intersected and do not have an overlapping part. No limitation will be given here.

At least one embodiment of the present disclosure provides a display substrate, which comprises a working area and a sealant setting area disposed outside of the working area. The display substrate further comprises: a base substrate, a first conductive structure disposed on a first side of the base substrate, and a second conductive structure disposed on one side of the first conductive structure away from the base substrate; both the first conductive structure and the second conductive structure are disposed in the sealant setting area; the second conductive structure at least includes an inclined part inclined relative to a main surface of the base substrate; and the inclined part is configured to allow at least part of light to be exited out directly over the first conductive structure after the light incident into the inclined part from a second side of the base substrate opposite to the first side is reflected, so that at least part of light incident from the second side of the base substrate opposite to the first side can reach the sealant setting area over the first conductive structure and irradiate the sealant, and the adhesive property of the sealant is improved and the sealant will not be easily damaged or stripped off under a mechanical vibration.

It is to be noted that the inclined part of at least partial second conductive structure and the first conductive structure are disposed in the sealant setting area, it is not limited to the case that the entire second conductive structure and the first conductive structure are all disposed in the sealant setting area.

It is also to be noted that the outside of the working area is not limited to an outer edge of the display substrate and it may also be a central area of the display substrate. For instance, a central punching area is used as the working area, and the periphery of the central punching area may also be referred to the outside of the working area.

Figure 5A:
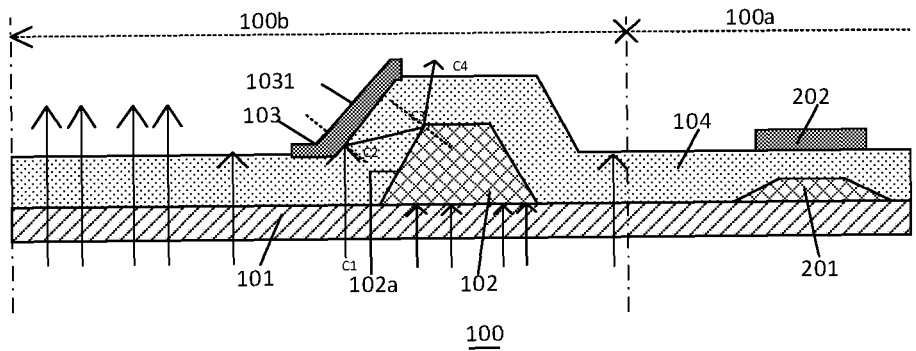
FIG. 5A is a schematically structural sectional view of a display substrate provided by an embodiment of the present disclosure.

For instance, FIG. 5A is a schematically structural sectional view of a display substrate provided by an embodiment of the present disclosure. As shown in FIG. 5A, a display substrate 100 comprises a working area 100a and a sealant setting area 100b disposed outside of the working area 100a. The display substrate 100 further comprises: a base substrate 101, a first conductive structure 102 disposed on a first side of the base substrate 101, and a second conductive structure 103 disposed on one side of the first conductive structure 102 away from the base substrate 101; both the first conductive structure 102 and the second conductive structure 103 are disposed in the sealant setting area 100b; the second conductive structure 103 at least includes an inclined part 1031 inclined relative to a main surface of the base substrate 101; and the inclined part 1031 is configured to allow at least part of light to be exited out directly over the first conductive structure 102 after the light incident into the inclined part 1031 from a second side of the base substrate 101 opposite to the first side is reflected by the inclined part 1031. The display substrate with the above structure can realize that at least part of light incident from the second side of the base substrate 101 opposite to the first side reaches the sealant setting area 100b over the first conductive structure 102 and irradiates the sealant (not shown in the figure), so that the adhesive property of the sealant is improved, and the sealant will not be easily damaged or stripped off under a mechanical vibration.

For instance, the material(s) of the first conductive structure 102 and the second conductive structure 103 may be conductive metal(s) or the like having reflection on the light.

For instance, an external light source is a line source which can ensure the uniformity of an incident light, so as to realize the whole uniformity of the light irradiating the sealant setting area 100b and provide guarantee for the uniformity of the finally formed sealant. In this way, the light incident into the inclined part 1031 from the second side of the base substrate 101 opposite to the first side can be perpendicular to the main surface of the base substrate 101.

For instance, black matrixes (BMs) are disposed on an opposite substrate cell-assembled with the display substrate 100. In the process of cell-assembling the display substrate and the opposite substrate, the BMs are disposed on one side of the sealant (not shown in the figure) away from the base substrate 101, and light cannot be incident from the side of the BM, or else, most light will be shielded, so the light cannot reach the sealant, and then the function of sealant curing cannot be achieved.

It is to be noted that "the inclined part inclined relative to the main surface of the base substrate" represents that the inclined part is not parallel to or perpendicular to the main surface of the base substrate, that is, an included angle between the inclined part and the main surface of the base substrate may be (0°, 90°), or (90°, 180°).

For instance, on one side of the inclined part 1031 away from the base substrate 101, on an end portion on one side of the inclined part 1031 near the base substrate 101, an included angle between the inclined part 1031 and a normal line of the main surface of the base substrate 101 running through the end portion is an acute angle.

For instance, in a direction perpendicular to the main surface of the base substrate 101, the first conductive structure 102 and the second conductive structure 103 are disposed between the base substrate 101 and the sealant to be formed in the sealant setting area 100b.

For instance, as shown in FIG. 5A, an orthographic projection of the inclined part 1031 on the base substrate 101 at least partially overlaps with an orthographic projection of the first conductive structure 102 on the base substrate 101. The structural design can reflect the light more fully, so as to increase the amount of light exited out directly over the first conductive structure 102.

For instance, as shown in FIG. 5A, the first conductive structure 102 includes a first inclined surface 102a inclined relative to the main surface of the base substrate 101; and the orthographic projection of the inclined part 1031 on the base substrate 101 at least partially overlaps with an orthographic projection of the first inclined surface 102a on the base substrate 101.

For instance, as shown in FIG. 5A, light C1 incident into a C2 position of the inclined part 1031 of the second conductive structure 103 from the second side of the base substrate 101 opposite to the first side is reflected by the inclined part 1031 and reaches a C3 position on the first conductive structure 102, and subsequently, after the light is reflected by the first conductive structure 102 at the C3 position, at least part of light is emitted to the sealant setting area 100b from a C4 position over the first conductive structure 102, and finally the light irradiates the sealant over the first conductive structure 102.

Figure 5B:
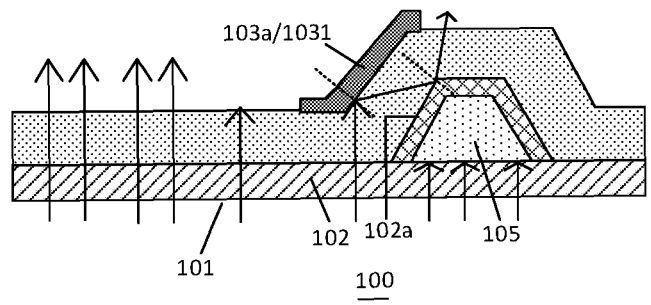
FIG. 5B is a schematically structural sectional view of another display substrate provided by an embodiment of the present disclosure.

For instance, FIG. 5B is a schematically structural sectional view of yet another display substrate provided by an embodiment of the present disclosure. As shown in FIG. 5B, the display substrate 100 further comprises a lug boss 105 disposed on the base substrate 101; an orthographic projection of a surface of the lug boss 105 away from the base substrate 101 on the base substrate 101 is within an orthographic projection of a surface of the lug boss 105 near the base substrate 101 on the base substrate 101; and a part corresponding to the first inclined surface 102a is disposed on a first side surface of the lug boss 105. The lug boss 105 provides a support for the first conductive structure 102, and the first inclined surface 102a of the first conductive structure 102 laps over the first side surface of the lug boss 105. The first inclined surface 102a is inclined relative to the main surface of the base substrate 101. The first conductive structure 102 with the structure can allow the first conductive structure 102 to block as little light as possible and allow as much light as possible to be incident into the sealant setting area 100b under the condition that the total length of the first conductive structure 102 is kept constant, that is, the resistance of the first conductive structure 102 is kept constant.

Figure 6:
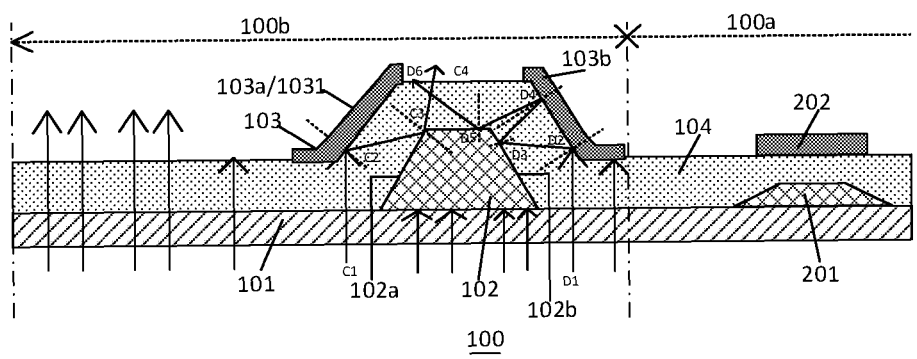
FIG. 6 is a schematically structural sectional view of yet another display substrate provided by an embodiment of the present disclosure.

For instance, FIG. 6 is a schematically structural sectional view of still another display substrate provided by an embodiment of the present disclosure. As shown in FIG. 6, a second conductive structure 103 includes a first part 103a and a second part 103b which are disposed in a direction parallel to a main surface of a base substrate 101, and both the first part 103a and the second part 103b include an inclined part 1031. For instance, both the inclined part 1031 of the first part 103a and the inclined part 1031 of the second part 103b reflect light which is incident into the inclined part from a second side of the base substrate 101 opposite to a first side and perpendicular to the main surface of the base substrate 101, so that more light can be emitted to a sealant setting area 100b from directly over a first conductive structure 102.

For instance, in the embodiment of the present disclosure, the light perpendicular to the main surface of the base substrate 101 may be that the light incident direction is substantially perpendicular to the main surface of the base substrate 101. For instance, the situation that an included angle between the light incident direction and the main surface of the base substrate 101 being 80°-100° can all represent that the light incident direction is perpendicular to the main surface of the base substrate 101.

For instance, in an example, the light incident into the inclined part 1031 from the second side of the base substrate 101 opposite to the first side is reflected by the inclined part 1031 and reaches the first conductive structure 102, and after the light is reflected by the first conductive structure 102, at least part of light is exited out directly over the first conductive structure 102.

For instance, as shown in FIG. 6, light C1 incident into a C2 position of the inclined part 1031 of the first part 103a of the second conductive structure 103 from the second side of the base substrate 101 opposite to the first side is reflected by the inclined part 1031 and reaches a C3 position on the first conductive structure 102, and subsequently, after the light is reflected by the first conductive structure 102 at the C3 position, at least part of light is emitted to the sealant setting area 100b from a C4 position over the first conductive structure 102, and finally the light irradiates the sealant over the first conductive structure 102.

For instance, as shown in FIG. 6, light D1 incident into a D2 position of the inclined part 1031 of the second part 103b of the second conductive structure 103 from the second side of the base substrate 101 opposite to the first side is reflected by the inclined part 1031 and reaches a D3 position on the first conductive structure 102; subsequently, the light is reflected by the first conductive structure 102 at the D3 position and reaches a D4 position of the inclined part 1031 of the second part 103b; after that, the light is reflected by the inclined part 1031 at the D4 position and reaches a D5 position on the first conductive structure 102; subsequently, after the light is reflected again by the first conductive structure 102 at the D5 position, at least part of light is emitted to the sealant setting area 100b from a D6 position over the first conductive structure 102; and finally, the light irradiates the sealant over the first conductive structure 102.

It is to be noted that the frequency that the light incident into the inclined part 1031 of the second conductive structure 103 from the second side of the base substrate 101 opposite to the first side is reflected by the first conductive structure 102 and the second conductive structure 103 is not limited, as long as at least part of light is exited out directly over the first conductive structure 102, reaches the sealant setting area 100b over the first conductive structure 102, and irradiates the sealant (not shown in the figure).

It is to be also noted that the reflection of the second conductive structure 103 on the light may also include the reflection of other parts in addition to the inclined part on the light.

For instance, as shown in FIG. 6, the first part 103a and the second part 103b of the second conductive structure 103 are spaced from each other at least in the sealant setting area in a direction parallel to the base substrate 101, and an orthographic projection of the first conductive structure 102 on the base substrate 101 is between an orthographic projection of an end portion of the inclined part 1031 of the first part 103a near the base substrate 101 on the base substrate 101 and an orthographic projection of an end portion of the inclined part 1031 of the second part 103b near the base substrate 101 on the base substrate 101, so that the orthographic projection of the first conductive structure 102 on the base substrate 101 can be within the range limited by orthographic projections of the first part 103a and the second part 103b of the second conductive structure 103 on the base substrate 101, and at least part of light can be exited out directly over the first conductive structure 102 after the light incident into the inclined part 1031 from the second side of the base substrate 101 opposite to the first side is reflected by the inclined part 1031.

For instance, the first part 103a and the second part 103b of the second conductive structure 103 are electrically connected in the entire circuit.

For instance, as shown in FIG. 6, the orthographic projection of the first conductive structure 102 on the base substrate 101 at least partially overlaps with an orthographic projection of the inclined part 1031 of the first part 103a of the second conductive structure 103 on the base substrate 101.

For instance, as shown in FIG. 6, the orthographic projection of the first conductive structure 102 on the base substrate 101 at least partially overlaps with an orthographic projection of the inclined part 1031 of the second part 103b of the second conductive structure 103 on the base substrate 101.

For instance, an overlapping area may be formed on the orthographic projection of the first conductive structure 102 on the base substrate 101, the orthographic projection of the inclined part 1031 of the first part 103a of the second conductive structure 103 on the base substrate 101, and the orthographic projection of the inclined part 1031 of the second part 103b of the second conductive structure 103 on the base substrate 101.

For instance, the orthographic projection of the first conductive structure 102 on the base substrate 101 at least partially overlaps with the orthographic projection of the inclined part 1031 of the first part 103a of the second conductive structure 103 on the base substrate 101 and/or the orthographic projection of the inclined part 1031 of the second part 103b on the base substrate 101, so that light can be reflected more fully, and more light can be exited out directly over the first conductive structure 102.

For instance, in the structure as shown in FIG. 6, the cross-sectional shape of the first conductive structure 102 is a regular trapezoid, such as isosceles trapezoid. The cross-sectional shape of the first conductive structure 102 may be designed to be a triangle, such as isosceles triangle, and right triangle, under allowable process conditions.

For instance, as shown in FIG. 6, an insulating layer 104 is disposed between the first conductive structure 102 and the second conductive structure 103 in the direction perpendicular to the main surface of the base substrate 101, and the insulating layer 104 electrically isolates the first conductive structure 102 and the second conductive structure 103. The insulating layer 104 is provided with a protrusion which is protruded towards one side away from the base substrate 101; an orthographic projection of a surface of the protrusion away from the base substrate 101 on the base substrate 101 is within an orthographic projection of a surface of the protrusion near the base substrate 101 on the base substrate 101; the insulating layer 104 includes a first surface and a second surface which are inclined relative to the main surface of the base substrate 101; the inclined part 1031 of the first part 103a of the second conductive structure 103 laps over the first surface of the insulating layer 104; and the inclined part 1031 of the second part 103b of the second conductive structure 103 laps over the second surface of the insulating layer 104.

Figure 7:
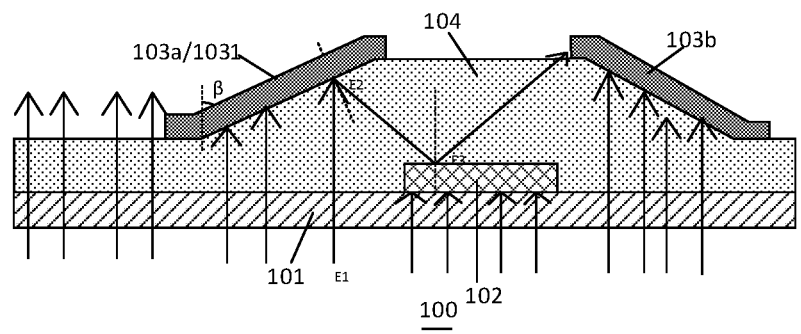
FIG. 7 is a schematically structural sectional view of still another display substrate provided by an embodiment of the present disclosure.

For instance, FIG. 7 is a schematically structural sectional view of still another display substrate provided by an embodiment of the present disclosure. As shown in FIG. 7, an orthographic projection of a first conductive structure 102 on a base substrate 101 is between an orthographic projection of a first part 103a of a second conductive structure 103 on the base substrate 101 and an orthographic projection of a second part 103b on the base substrate 101.

For instance, when the length of the first conductive structure 102 is designed to be very short, the orthographic projection of the first conductive structure 102 on the base substrate 101 does not overlap with an orthographic projection of an inclined part 1031 of the first part 103a of the second conductive structure 103 on the base substrate 101 and an orthographic projection of an inclined part 1031 of the second part 103b of the second conductive structure 103 on the base substrate 101, and does not overlap with the entire first part 103a and the entire second part 103b. In this way, light can be basically exited out directly over the first conductive structure 102 and will not be blocked by the second conductive structure 103, so the amount of light exited out directly over the first conductive structure 102 can be increased.

Figure 8:
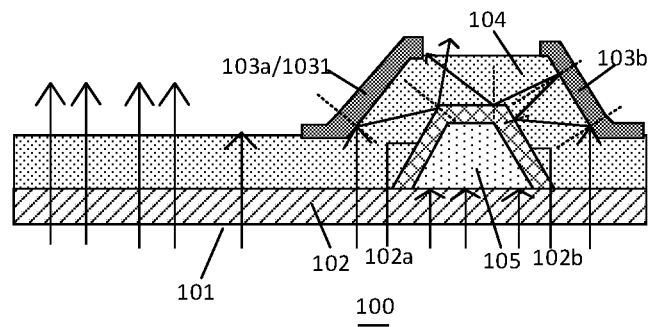
FIG. 8 is a schematically structural sectional view of still another display substrate provided by an embodiment of the present disclosure.

For instance, FIG. 8 is a schematically structural sectional view of still another display substrate provided by an embodiment of the present disclosure. As shown in FIG. 8, a display substrate 100 further comprises a lug boss 105 disposed on a base substrate 101; an orthographic projection of a surface of the lug boss 105 away from the base substrate 101 on the base substrate 101 is within an orthographic projection of a surface of the lug boss 105 near the base substrate 101 on the base substrate 101; a part corresponding to a first inclined surface 102a of a first conductive structure 102 is disposed on a first side surface of the lug boss 105; and a part corresponding to a second inclined surface 102b of the first conductive structure 102 is disposed on a second side surface of the lug boss 105 opposite to the first side surface.

For instance, the lug boss 105 provides a support for the first conductive structure 102; the first inclined surface 102a of the first conductive structure 102 laps over the first side surface of the lug boss 105; and the second inclined surface 102b of the first conductive structure 102 laps over the second side surface of the lug boss 105.

For instance, as shown in FIG. 8, the first conductive structure 102 includes the first inclined surface 102a and the second inclined surface 102b which are disposed in a direction parallel to a main surface of the base substrate 101, and the first inclined surface 102a and the second inclined surface 102b are inclined relative to the main surface of the base substrate 101. The first conductive structure 102 with the structure can allow the first conductive structure 102 to block as little light as possible and allow as much light as possible to be incident into a sealant setting area 100b under the condition that the total length of the first conductive structure 102 is kept constant, that is, the resistance of the first conductive structure 102 is kept constant.

For instance, the materials of the lug boss 105 are inorganic insulating materials, and no process step may be increased in the process of forming the lug boss 105. For instance, in a working area, an inorganic insulating layer will also be added between the base substrate and a gate electrode in order to prevent metallic ions, especially copper ions, in the gate electrode from being diffused to the base substrate. By a patterning process, the inorganic insulating layer can include the lug boss 105.

For instance, in the structures as shown in FIGS. 6 and 8, the first inclined surface 102*a* of the first conductive structure 102 is parallel to the inclined part 1031 of the first part 103*a* of the second conductive structure 103, and the second inclined surface 102*b* of the first conductive structure 102 is parallel to the inclined part 1031 of the second part 103*b* of the second conductive structure 103. The design of this structure can provide more convenience for light incident into the inclined part 1031 from the second side of the base substrate 101 opposite to the first side to reach the first conductive structure 102 after being reflected by the inclined part 1031, and for at least part of light to be exited out directly over the first conductive structure 102 after being reflected by the first conductive structure 102.

Figure 9:
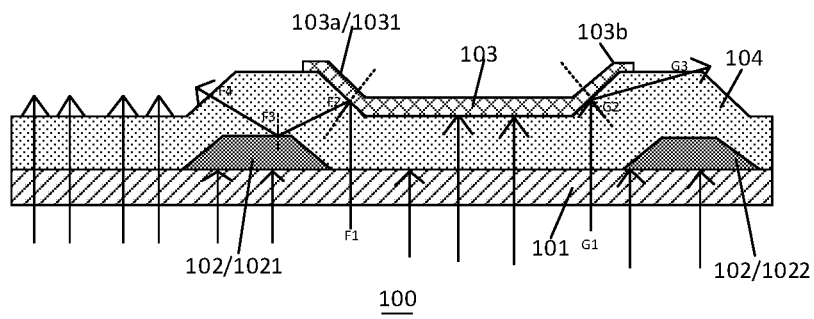
FIG. 9 is a schematically structural sectional view of still another display substrate provided by an embodiment of the present disclosure.

For instance, FIG. 9 is a schematically structural sectional view of still another display substrate provided by an embodiment of the present disclosure. As shown in FIG. 9, a first part 103*a* and a second part 103*b* of a second conductive structure 103 are connected with each other, and a first conductive structure 102 includes a third part 1021 and a fourth part 1022 which are spaced from each other in a direction parallel to a base substrate 101.

For instance, as shown in FIG. 9, an orthographic projection of an end portion of an inclined part 1031 of the first part 103*a* of the second conductive structure 103 away from the base substrate 101 on the base substrate 101 is within an orthographic projection of the third part 1021 of the first conductive structure 102 on the base substrate 101, and an orthographic projection of an end portion of an inclined part 1031 of the second part 103*b* of the second conductive structure 103 away from the base substrate 101 on the base substrate 101 is within an orthographic projection of the fourth part 1022 of the first conductive structure 102 on the base substrate 101. The design of the structure can provide more convenience for light incident into the inclined part 1031 from a second side of the base substrate 101 opposite to a first side to reach the first conductive structure 102 after being reflected by the inclined part 1031, and for at least part of light to be exited out directly over the first conductive structure 102 after the light is reflected by the first conductive structure 102, or provides more convenience for at least part of light incident into the inclined part 1031 from the second side of the base substrate 101 opposite to the first side to be exited out directly over the first conductive structure 102.

For instance, as shown in FIG. 9, light F1 incident into an F2 position of the inclined part 1031 of the first part 103*a* of the second conductive structure 103 from the second side of the base substrate 101 opposite to the first side reaches an F3 position on the first conductive structure 102 after being reflected by the inclined part 1031, and subsequently, at least part of light is emitted to the sealant setting area 100*b* from an F4 position over the first conductive structure 102 after the light is reflected by the first conductive structure 102 at the F3 position, and finally, the light irradiates the sealant over the first conductive structure 102.

For instance, as shown in FIG. 9, after light G1 incident into a G2 position of the inclined part 1031 of the second part 103*b* of the second conductive structure 103 from the second side of the base substrate 101 opposite to the first side is reflected by the inclined part 1031, at least part of light is directly emitted to the sealant setting area 100*b* from a G3 position over the first conductive structure 102 and finally irradiates the sealant over the first conductive structure 102.

Figure 10:
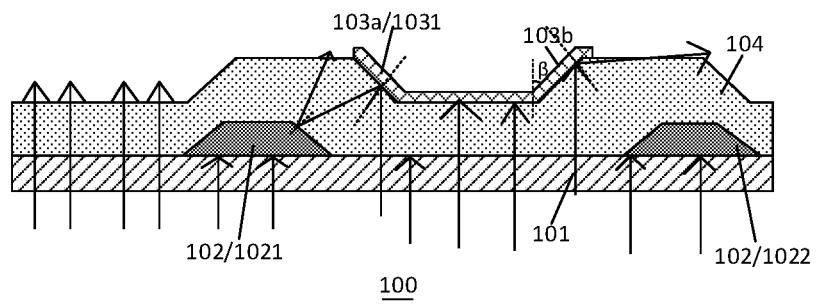
FIG. 10 is a schematically structural sectional view of still another display substrate provided by an embodiment of the present disclosure.

For instance, FIG. 10 is a schematically structural sectional view of still another display substrate provided by an embodiment of the present disclosure. As shown in FIG. 10, an orthographic projection of an entire second conductive structure 103 on a base substrate 101 is between an orthographic projection of a third part 1021 of a first conductive structure 102 on the base substrate 101 and an orthographic projection of a fourth part 1022 on the base substrate 101. The design of this structure can reduce the shielding of the second conductive structure on the first conductive structure, so that more light can be exited out directly over the first conductive structure 102.

For instance, in the structure as shown in FIGS. 9 and 10, an insulating layer 104 is disposed between the first conductive structure 102 and the second conductive structure 103 in a direction perpendicular to the base substrate 101, and the insulating layer includes a recessed part which is recessed towards one side near the base substrate 101.

For instance, the cross-sectional shape of the recessed part is trapezoid in a plane perpendicular to the main surface of the base substrate 101, and the side length of the side of the trapezoid away from the base substrate 101 is greater than the side length of the side of the trapezoid near the base substrate 101.

For instance, the inclined part 1031 of the first part 103*a* of the second conductive structure 103 is disposed on a first side surface of the recessed part, and the inclined part 1031 of the second part 103*b* of the second conductive structure 103 is disposed on a second side surface of the recessed part opposite to the first side surface.

For instance, in any above example, on one side away from the base substrate 101, on an end portion on one side of the inclined part 1031 near the base substrate 101, an included angle between the inclined part 1031 and a normal line of the main surface of the base substrate 101 running through the end portion is 20°-80°. For instance, as shown in FIG. 7, an included angle β in FIG. 7 is 20°-80°. As shown in FIG. 10, the included angle β in FIG. 10 is 20°-80°.

For instance, in any above example, on one side away from the base substrate 101, on an end portion on one side of the inclined part 1031 near the base substrate 101, an included angle between the inclined part 1031 and a normal line of the main surface of the base substrate 101 running through the end portion is 40°-60°. For instance, as shown in FIG. 7, an included angle β in FIG. 7 is 40°-60°. As shown in FIG. 10, the included angle β in FIG. 10 is 40°-60°.

For instance, on one side away from the base substrate 101, on an end portion on one side of the inclined part 1031 near the base substrate 101, an included angle between the inclined part 1031 and a normal line of the main surface of the base substrate 101 running through the end portion is 40°, 45°, 50°, 55° or 60°.

For instance, the above included angle ranges can provide more convenience for at least part of light to be exited out directly over the first conductive structure 102 after the light incident into the inclined part 1031 from the second side of the base substrate 101 opposite to the first side is reflected by the inclined part 1031.

For instance, in the display substrate as shown in FIG. 6, a first electrode 201 and a second electrode 202 are disposed in a working area 100*a*; the first conductive structure 102 in a sealant setting area 100*b* and the first electrode 201 are formed by a same patterning process; and the second conductive structure 103 and the second electrode are formed by a same patterning process.

For instance, the display substrate 100 is an array substrate, and data lines and gate scanning lines intersecting horizontally and vertically are formed on a base substrate 101 of the array substrate, and are encircled to form a plurality of pixel units. A TFT switch and a pixel electrode are formed in each pixel unit. The TFT switch includes a gate electrode, an active layer, a source electrode and a drain electrode. At an intersection region of the data line and the gate scanning line, the gate electrode is connected with the gate scanning line, the source electrode is connected with the data line, the drain electrode is connected with the pixel electrode, and the source electrode and the drain electrode are conducted through the active layer under the turn-on voltage of the gate electrode, so as to communicate the data line and the pixel electrode. Common electrode lines running through the pixel units are also arranged on the array substrate, the common electrode lines are connected with common electrodes at the periphery of the array substrate, and the common electrode lines provide constant voltage for the common electrodes. Insulating materials, such as a gate insulating layer and a passivation layer, may be disposed between various layers of conductive material structures of the display substrate to keep insulation.

For instance, the first electrode may be any one of the gate electrode, the source electrode, the drain electrode, the pixel electrode, or the common electrode, and the second electrode may be another one of the above electrodes different from the first electrode.

For instance, the first electrode is the gate electrode and the second electrode is the source/drain electrode; or the first electrode is the source/drain electrode and the second electrode is the gate electrode.

For instance, a light-emitting diode (LED), a VDD line, a VSS line, etc. are disposed in the working area 100a of the display substrate 100.

For instance, the first electrode is any one of the VDD line, the VSS line, an anode, or a cathode, and the second electrode may be another one of the above different from the first electrode.

For instance, an LED is disposed in the working area 100a of the display substrate 100 and includes an anode and a cathode; the first electrode is the anode and the second electrode is the cathode; or the second electrode is the anode and the first electrode is the cathode.

For instance, the first conductive structure and the second conductive structure are configured to transmit data signals, gate scanning signals, common electrode signals (COM), clock signals (CLK), gate control signals, GOA forward scanning signals (VSD), GOA reverse scanning signals (VDS), or trigger signals (STV), etc.

For instance, the data signals are source signals (Vdata signals).

For instance, the gate control signals include: gate on signals (VGH) and gate off signals (VGL).

For instance, the trigger signal (STV) is also referred to as gate on signal or vertical synchronous signal.

For instance, the first conductive structure and the second conductive structure may transmit same signals or different signals.

Figure 11:
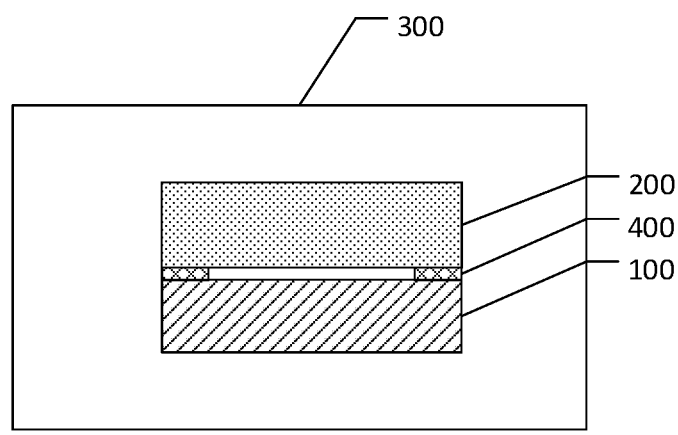
FIG. 11 is a block diagram of a display device provided by an embodiment of the present disclosure.

At least one embodiment of the present disclosure also provides a display device, which comprises the display substrate provided by any above embodiment and an opposite substrate cell-assembled with the display substrate. For instance, FIG. 11 is a block diagram of a display device provided by an embodiment of the present disclosure. As shown in FIG. 11, in the display device 300, the display substrate 100 and an opposite substrate 200 are connected with each other by sealant 400 disposed in the sealant setting area, and in the direction perpendicular to the base substrate, the first conductive structure and the second conductive structure are disposed between the base substrate and the sealant 400.

For instance, the opposite substrate 200 is a color filter (CF) substrate which includes latticed black matrices; CF resins are filled among the BMs; and regions formed by BM grids respectively correspond to pixel units. Electrical fields that drive a liquid crystal layer to be twisted are formed between common electrodes and pixel electrodes on an array substrate. In order to maintain the distance between the array substrate and the CF substrate after cell-assembly, post spacers are also usually formed on the BMs of the CF substrate, and after cell-assembly, the post spacers are against TFT switches of the array substrate to maintain the distance between the array substrate and the CF substrate.

For instance, the display device 300 may be: any product or component with display function, such as a liquid crystal display (LCD) panel, e-paper, a mobile phone, a tablet PC, a TV, a display, a notebook computer, a digital album, or a navigator.

Figure 12:
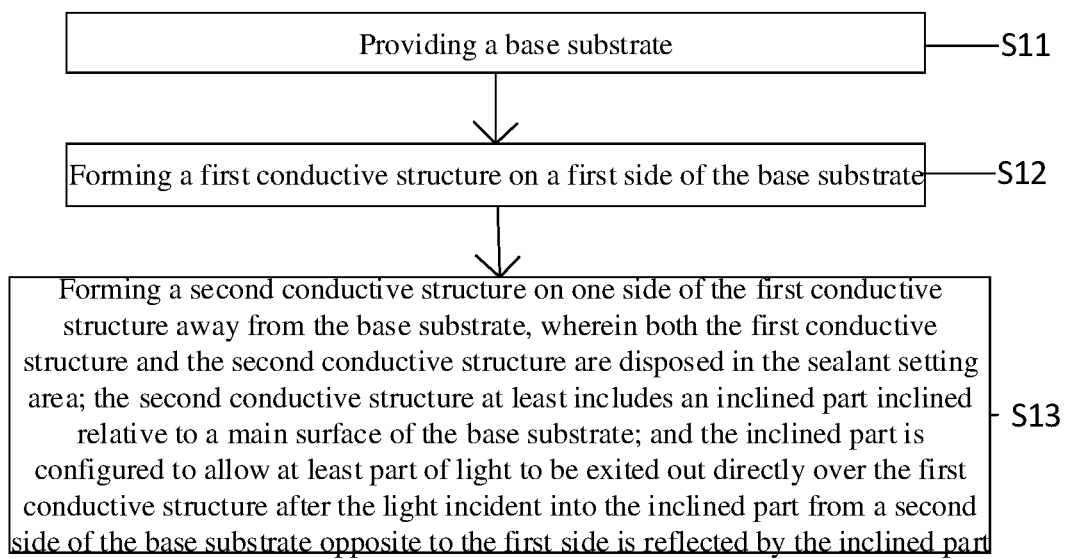
FIG. 12 is a flowchart of a method of manufacturing a display substrate provided by an embodiment of the present disclosure.

At least one embodiment of the present disclosure also provides a method of manufacturing a display substrate. For instance, FIG. 12 is a flowchart of a method of manufacturing a display substrate provided by an embodiment of the present disclosure. As shown in FIG. 12, the display substrate includes a working area and a sealant setting area disposed outside of the working area. The manufacturing method comprises the following steps:

S11: providing a base substrate.

S12: forming a first conductive structure on a first side of the base substrate.

S13: forming a second conductive structure on one side of the first conductive structure away from the base substrate, in which both the first conductive structure and the second conductive structure are disposed in the sealant setting area; the second conductive structure at least includes an inclined part inclined relative to a main surface of the base substrate; and the inclined part is configured to allow at least part of light to be exited out directly over the first conductive structure after the light incident into the inclined part from a second side of the base substrate opposite to the first side is reflected by the inclined part.

For instance, a first electrode and a second electrode are disposed in the working area; the first conductive structure in the sealant setting area and the first electrode are formed by a same patterning process; and the second conductive structure in the sealant setting area and the second electrode are formed by a same patterning process.

For instance, the first conductive structure and the second conductive structure are configured to transmit data signals, gate scanning signals, common electrode signals (COM), clock signals (CLK), gate control signals, GOA forward scanning signals (VSD), GOA reverse scanning signals (VDS), trigger signals (STV), etc.

For instance, the data signals are source signals (Vdata signals).

For instance, the gate control signals include: gate on signals (VGH) and gate off signals (VGL).

For instance, the trigger signal (STV) is also referred to as gate on signal or vertical synchronous signal.

For instance, the first conductive structure and the second conductive structure may transmit same signals or different signals.

For instance, the display substrate is an array substrate, and data lines and gate scanning lines intersecting horizontally and vertically are formed on a base substrate of the array substrate, and are encircled to form a plurality of pixel units. A TFT switch and a pixel electrode are formed in each pixel unit. The TFT switch includes a gate electrode, an active layer, a source electrode and a drain electrode. Common electrode lines running through the pixel units are also arranged on the array substrate, the common electrode lines are connected with common electrodes at the periphery of the array substrate, and provide constant voltage for the common electrodes. Insulating materials, such as a gate insulating layer and a passivation layer, may be disposed between various layers of conductive material structures of the display substrate to keep insulation.

For instance, the first electrode may be any one of the gate electrode, the source electrode, the drain electrode, the pixel electrode, or the common electrode, and the first conductive structure and the first electrode are formed in a same process step; and the second electrode may be another one of the above electrodes different from the first electrode, and the second conductive structure and the second electrode are formed in a same process step.

For instance, the first electrode is the gate electrode; the first conductive structure and the gate electrode are formed in a same process step; the second electrode is the source/drain electrode; and the second conductive structure and the source/drain electrode are formed in a same process step. Or the first electrode is the source/drain electrode; the first conductive structure and the source/drain electrode are formed in a same process step; the second electrode is the gate electrode; and the second conductive structure and the gate electrode are formed in a same process step.

For instance, an LED, a VDD line, a VSS line, etc. are disposed in the working area of the display substrate.

For instance, the first electrode is any one of the VDD line, the VSS line, an anode, or a cathode, and the second electrode may be another one of the above different from the first electrode.

For instance, an LED is disposed in the working area of the display substrate and includes an anode and a cathode; the first electrode is the anode; the first conductive structure and the anode are formed in a same process step; the second electrode is the cathode; and the second conductive structure and the cathode are formed in a same process step. Or the second electrode is the anode; the second conductive structure and the anode are formed in a same process step; the first electrode is the cathode; and the first conductive structure and the cathode are formed in a same process step.

For instance, the base substrate may be a flexible base substrate or a rigid base substrate. The base substrate may be a glass substrate, a quartz substrate, a plastic substrate, etc.

For instance, the display substrate manufactured by the above manufacturing method can allow at least part of light incident from the second side of the base substrate opposite to the first side to reach the sealant setting area over the first conductive structure and irradiate the sealant, and the adhesive property of the sealant is improved, so that the sealant cannot be easily damaged or stripped off under a mechanical vibration.

For instance, in the method of manufacturing the display substrate provided by at least one embodiment of the present disclosure, in an example, before forming the first conductive structure, the method further comprises forming a lug boss on the base substrate. An orthographic projection of a surface of the lug boss away from the base substrate on the base substrate is within an orthographic projection of a surface of the lug boss near the base substrate on the base substrate.

For instance, the forming the first conductive structure on the first side of the base substrate includes: forming the first conductive structure on a surface of the lug boss, in which the first conductive structure includes a first inclined surface and a second inclined surface which are disposed in a direction parallel to the base substrate; and the first inclined surface and the second inclined surface are inclined relative to the main surface of the base substrate. The first conductive structure with the structure can allow the first conductive structure to shield as little light as possible and allow as much light as possible to be incident into the sealant setting area under the condition of ensuring that the total length of the first conductive structure is kept unchanged.

For instance, the lug boss provides a support for the first conductive structure; the first inclined surface of the first conductive structure laps over a first side surface of the lug boss; and the second inclined surface of the first conductive structure laps over a second side surface of the lug boss.

For instance, the cross-sectional shape of the first conductive structure is a regular trapezoid, such as isosceles trapezoid. Under allowable process conditions, the sectional shape of the first conductive structure may be designed to be a triangle, such as isosceles triangle, or right triangle.

For instance, the materials of the lug boss are inorganic insulating materials, and no process step may be added in the step of forming the lug boss. For instance, in the working area, an inorganic insulating layer will also be added between the base substrate and the gate electrode in order to prevent metallic ions, especially copper ions, in the gate electrode from being diffused to the base substrate. By adoption of the patterning process, the inorganic insulating layer may include the lug boss.

For instance, in another example, the method of manufacturing the display substrate further comprises: after forming the first conductive structure and before forming the second conductive structure, forming an insulating layer on the first conductive structure, in which the insulating layer includes a protrusion which is protruded towards one side away from the base substrate; an orthographic projection of a surface of the protrusion away from the base substrate on the base substrate is within an orthographic projection of a surface of the protrusion near the base substrate on the base substrate; and the inclined part is disposed on a side surface of the protrusion.

For instance, the insulating layer includes a first surface and a second surface which are inclined relative to the main surface of the base substrate; the inclined part of the first part of the second conductive structure laps over the first surface of the insulating layer; and the inclined part of the second part of the second conductive structure laps over the second surface of the insulating layer.

For instance, in still another example, the method of manufacturing the display substrate further comprises: after forming the first conductive structure and before forming the second conductive structure, forming an insulating layer on the first conductive structure, in which the first conductive structure includes a third part and a fourth part which are spaced from each other in the direction parallel to the base substrate; the insulating layer includes a recessed part which is recessed towards one side near the base substrate; an orthographic projection of a surface of the recessed part near the base substrate on the base substrate is within an orthographic projection of a surface of the recessed part away from the base substrate on the base substrate; and the inclined part is disposed on a side surface of the recessed part.

For instance, an orthographic projection of an end portion of an inclined part of the first part of the second conductive structure away from the base substrate on the base substrate is within an orthographic projection of the third part of the first conductive structure on the base substrate, and an orthographic projection of an end portion of an inclined part of the second part of the second conductive structure away from the base substrate on the base substrate is within an orthographic projection of the fourth part of the first conductive structure on the base substrate. The design of the structure can provide more convenience for light incident into the inclined part from the second side of the base substrate opposite to the first side to reach the first conductive structure after being reflected by the inclined part, and for at least part of light to be exited out directly over the first conductive structure after the light is reflected by the first conductive structure, or provides more convenience for at least part of the light incident into the inclined part from the second side of the base substrate opposite to the first side to be exited out directly over the first conductive structure.

For instance, in the method of manufacturing the display substrate, an orthographic projection of the entire second conductive structure on the base substrate may also be between an orthographic projection of the third part of the first conductive structure on the base substrate and an orthographic projection of the fourth part on the base substrate. The design of this structure can reduce the shielding of the second conductive structure on the first conductive structure, so that more light can be exited out directly over the first conductive structure.

For instance, the cross-sectional shape of the recessed part is a trapezoid in a plane perpendicular to the main surface of the base substrate, and the side length of the side of the trapezoid away from the base substrate is greater than the side length of the side of the trapezoid near the base substrate.

For instance, the inclined part of the first part of the second conductive structure is disposed on a first side surface of the recessed part; and the inclined part of the second part of the second conductive structure is disposed on a second side surface of the recessed part opposite to the first side surface.

The display substrate, the manufacturing method thereof and the display device provided by embodiments of the present disclosure have at least one of the following advantages:

(1) The display substrate provided by at least one embodiment of the present disclosure can allow at least part of light to be emitted to the sealant setting area from directly over the first conductive structure and irradiates the sealant, and improve the adhesive property of the sealant, so that the sealant will not be easily damaged or stripped off under a mechanical vibration.

(2) In the display substrate provided by at least one embodiment of the present disclosure, the orthographic projection of the first conductive structure on the base substrate, the orthographic projection of the inclined part of the first part of the second conductive structure on the base substrate, and/or the orthographic projection of the inclined part of the second part on the base substrate are at least partially overlapped with each other. In this way, light can be reflected more fully, so more light can be exited out directly over the first conductive structure.

(3) In the display substrate provided by at least one embodiment of the present disclosure, when the length of the first conductive structure is designed to be very short, the orthographic projection of the first conductive structure on the base substrate does not overlap with the orthographic projection of the inclined part of the first part of the second conductive structure on the base substrate and the orthographic projection of the inclined part of the second part of the second conductive structure on the base substrate, and does not overlap with the entire first part and the entire second part, so the light can be basically exited out directly over the first conductive structure and is not blocked by the second conductive structure, the amount of light exited out directly over the first conductive structure is increased.

(4) The display substrate provided by at least one embodiment of the present disclosure comprises the lug boss disposed on the base substrate; a part corresponding to the first inclined surface of the first conductive structure is disposed on the first side surface of the lug boss; a part corresponding to the second inclined surface of the first conductive structure is disposed on the second side surface of the lug boss opposite to the first side surface; the lug boss provides a support for the first conductive structure; the first inclined surface of the first conductive structure laps over the first side surface of the lug boss; the second inclined surface of the first conductive structure laps over the second side surface of the lug boss; and the lug boss can realize the support to the first conductive structure and reduce the resistance of the first conductive structure.

The following points should be explained:

(1) The drawings of the embodiments of the present disclosure only relate to the structures related to the embodiments of the present disclosure, and other structures can refer to a common design.

(2) For the sake of clarity, in the drawings used to describe the embodiments of the present disclosure, the thickness of layers or regions is enlarged or reduced, that is, these drawings are not drawn to actual scales. It is to be understood that when an element, such as a layer, a film, a region, or a substrate is referred to as being "on" or "under" another element, it can be "directly" on the another element, or there may be an intermediate element.

(3) Without conflicting with each other, the embodiments of the present disclosure and the elements in the embodiments may be combined with each other to obtain new embodiments.

The description above is only specific embodiments of the present disclosure, and the scope of the present disclosure is not limited thereto. The scope of the present disclosure should be defined by the claims.

What is claimed is:

1. A display substrate, comprising a working area and a sealant setting area outside of the working area, wherein
the display substrate further comprises: a base substrate, a first conductive structure provided on a first side of the base substrate, and a second conductive structure provided on one side of the first conductive structure away from the base substrate;
both the first conductive structure and the second conductive structure are provided in the sealant setting area;
the second conductive structure at least includes an inclined part inclined relative to a main surface of the base substrate; and the inclined part is configured to allow at least part of light to be exited out directly over the first conductive structure after the light incident into the inclined part from a second side of the base substrate opposite to the first side is reflected by the inclined part; and
wherein an orthographic projection of the inclined part on the base substrate at least partially overlaps with an orthographic projection of the first conductive structure on the base substrate.

2. The display substrate according to claim 1, wherein the first conductive structure includes a first inclined surface inclined relative to the main surface of the base substrate; and the orthographic projection of the inclined part on the base substrate at least partially overlaps with an orthographic projection of the first inclined surface on the base substrate; and
wherein the second conductive structure includes a first part and a second part which are provided in a direction parallel to the main surface of the base substrate; and both the first part and the second part include the inclined part.

3. The display substrate according to claim 2, further comprising a lug boss provided on the base substrate, wherein an orthographic projection of a surface of the lug boss away from the base substrate on the base substrate is within an orthographic projection of a surface of the lug boss near the base substrate on the base substrate; and a part corresponding to the first inclined surface is provided on a first side surface of the lug boss.

4. The display substrate according to claim 2, wherein the first part and the second part are spaced from each other; and the orthographic projection of the first conductive structure on the base substrate is between an orthographic projection of an end portion of the inclined part of the first part near the base substrate on the base substrate and an orthographic projection of an end portion of the inclined part of the second part near the base substrate on the base substrate.

5. The display substrate according to claim 4, wherein the orthographic projection of the first conductive structure on the base substrate at least partially overlaps with an orthographic projection of the inclined part of the first part on the base substrate, and/or the orthographic projection of the first conductive structure on the base substrate at least partially overlaps with an orthographic projection of the inclined part of the second part on the base substrate; or
wherein the orthographic projection of the first conductive structure on the base substrate is between an orthographic projection of the first part on the base substrate and an orthographic projection of the second part on the base substrate.

6. The display substrate according to claim 5, wherein the first conductive structure includes the first inclined surface and a second inclined surface which are provided in a direction parallel to the base substrate; and the first inclined surface and the second inclined surface are inclined relative to the main surface of the base substrate.

7. The display substrate according to claim 6, further comprising a lug boss provided on the base substrate,
wherein an orthographic projection of a surface of the lug boss away from the base substrate on the base substrate is within an orthographic projection of a surface of the lug boss near the base substrate on the base substrate; a part corresponding to the first inclined surface is provided on a first side surface of the lug boss; and a part corresponding to the second inclined surface is provided on a second side surface of the lug boss opposite to the first side surface.

8. The display substrate according to claim 7, wherein the first inclined surface is parallel to the inclined part of the first part; and the second inclined surface is parallel to the inclined part of the second part.

9. The display substrate according to claim 5, wherein in a direction perpendicular to the main surface of the base substrate, an insulating layer is provided between the first conductive structure and the second conductive structure and the insulating layer includes a protrusion protruded towards one side away from the base substrate;
an orthographic projection of a surface of the protrusion away from the base substrate on the base substrate is within an orthographic projection of a surface of the protrusion near the base substrate on the base substrate; and
the inclined part is provided on a side surface of the protrusion.

10. The display substrate according to claim 2, wherein the first part and the second part are connected with each other; and
the first conductive structure includes a third part and a fourth part spaced from each other in a direction parallel to the base substrate.

11. The display substrate according to claim 10, wherein an orthographic projection of an end portion of the inclined part of the first part away from the base substrate on the base substrate is within an orthographic projection of the third part on the base substrate; and an orthographic projection of an end portion of the inclined part of the second part away from the base substrate on the base substrate is within an orthographic projection of the fourth part on the base substrate; or
wherein an orthographic projection of the second conductive structure on the base substrate is between an orthographic projection of the third part on the base substrate and an orthographic projection of the fourth part on the base substrate.

12. The display substrate according to claim 11, wherein an insulating layer is provided between the first conductive structure and the second conductive structure in a direction perpendicular to the main surface of the base substrate, and the insulating layer includes a recessed part which is recessed towards one side near the base substrate;
a cross-sectional shape of the recessed part is trapezoid in a plane perpendicular to the main surface of the base substrate, a side length of a side of the trapezoid away from the base substrate is greater than a side length of a side of the trapezoid near the base substrate;
the inclined part of the first part is provided on a first side surface of the recessed part; and the inclined part of the second part is provided on a second side surface of the recessed part opposite to the first side surface.

13. The display substrate according to claim 5, wherein on one side of the inclined part away from the base substrate, on an end portion on one side of the inclined part near the base substrate, an included angle between the inclined part and a normal line of the main surface of the base substrate running through the end portion is 20°-80°.

14. The display substrate according to claim 13, wherein on one side of the inclined part away from the base substrate, on the end portion on one side of the inclined part near the base substrate, the angle between the inclined part and the normal line of the main surface of the base substrate running through the end portion is 40°-60°.

15. The display substrate according to claim 5, wherein a first electrode and a second electrode are provided in the working area; the first conductive structure and the first electrode are formed by a same patterning process; and the second conductive structure and the second electrode are formed by a same patterning process; and
wherein thin-film transistors (TFTs) are provided in the working area, each TFT includes a gate electrode and source/drain electrodes; and the first electrode is the gate electrode and the second electrode is the source/drain electrode; or the first electrode is the source/drain electrode and the second electrode is the gate electrode.

16. A display device, comprising a display substrate and an opposite substrate cell-assembled with the display substrate, wherein the display substrate comprises: a working area and a sealant setting area outside of the working area, wherein the display substrate further comprises: a base substrate, a first conductive structure provided on a first side of the base substrate, and a second conductive structure provided on one side of the first conductive structure away from the base substrate; both the first conductive structure and the second conductive structure are provided in the sealant setting area; the second conductive structure at least includes an inclined part inclined relative to a main surface of the base substrate; and the inclined part is configured to allow at least part of light to be exited out directly over the first conductive structure after the light incident into the inclined part from a second side of the base substrate opposite to the first side is reflected by the inclined part; and
    wherein the display substrate and the opposite substrate are connected with each other through sealant provided in the sealant setting area; and
    in a direction perpendicular to the base substrate, the first conductive structure and the second conductive structure are provided between the base substrate and the sealant; and
    wherein an orthographic projection of the inclined part on the base substrate at least partially overlaps with an orthographic projection of the first conductive structure on the base substrate.

17. A method of manufacturing a display substrate, wherein the display substrate includes a working area and a sealant setting area provided outside of the working area; and the manufacturing method comprises:
    providing a base substrate;
    forming a first conductive structure on a first side of the base substrate; and
    forming a second conductive structure on one side of the first conductive structure away from the base substrate, in which
    both the first conductive structure and the second conductive structure are provided in the sealant setting area;
    the second conductive structure at least includes an inclined part inclined relative to a main surface of the base substrate; and the inclined part is configured to allow at least part of light to be exited out directly over the first conductive structure after the light incident into the inclined part from a second side of the base substrate opposite to the first side is reflected by the inclined part; and
    wherein an orthographic projection of the inclined part on the base substrate at least partially overlaps with an orthographic projection of the first conductive structure on the base substrate.

18. The manufacturing method according to claim 17, further comprising
    before forming the first conductive structure, forming a lug boss on the base substrate; an orthographic projection of a surface of the lug boss away from the base substrate on the base substrate is within an orthographic projection of a surface of the lug boss near the base substrate on the base substrate; and
    the forming the first conductive structure on the first side of the base substrate includes: forming the first conductive structure on a surface of the lug boss.

19. The manufacturing method according to claim 18, further comprising: after forming the first conductive structure and before forming the second conductive structure, forming an insulating layer on the first conductive structure;
    wherein the insulating layer includes a protrusion protruded towards one side away from the base substrate;
    an orthographic projection of a surface of the protrusion away from the base substrate on the base substrate is within an orthographic projection of a surface of the protrusion near the base substrate on the base substrate; and
    the inclined part is provided on a side surface of the protrusion; or
    wherein the first conductive structure includes a third part and a fourth part spaced from each other in a direction parallel to the base substrate;
    the insulating layer includes a recessed part recessed towards one side near the base substrate;
    an orthographic projection of a surface of the recessed part near the base substrate on the base substrate is within an orthographic projection of a surface of the recessed part away from the base substrate on the base substrate; and
    the inclined part is provided on a side surface of the recessed part.

\* \* \* \* \*